United States Patent
Miyagoe (10) Patent No.: US 9,025,266 B2
(45) Date of Patent: May 5, 2015

(54) SEMICONDUCTOR INTEGRATED CIRCUIT DEVICE, MAGNETIC DISK STORAGE DEVICE, AND ELECTRONIC APPARATUS

(71) Applicant: Rohm Co., Ltd., Kyoto (JP)

(72) Inventor: Yasuhiro Miyagoe, Kyoto (JP)

(73) Assignee: Rohm Co., Ltd. (JP)

( * ) Notice: Subject to any disclaimer, the term of this patent is extended or adjusted under 35 U.S.C. 154(b) by 4 days.

(21) Appl. No.: 13/918,245

(22) Filed: Jun. 14, 2013

(65) Prior Publication Data
US 2014/0368943 A1   Dec. 18, 2014

(51) Int. Cl.
| | |
|---|---|
| G11B 5/09 | (2006.01) |
| H01L 29/788 | (2006.01) |
| H01L 27/092 | (2006.01) |
| G11B 5/02 | (2006.01) |
| H02P 6/00 | (2006.01) |

(52) U.S. Cl.
CPC .............. H01L 27/0921 (2013.01); G11B 5/02 (2013.01); H02P 6/002 (2013.01)

(58) Field of Classification Search
None
See application file for complete search history.

(56) References Cited

U.S. PATENT DOCUMENTS

| | | | | |
|---|---|---|---|---|
| 6,340,873 | B2 * | 1/2002 | Seki et al. ............... | 318/400.33 |
| 7,265,434 | B2 * | 9/2007 | Williams et al. .......... | 257/552 |
| 7,868,414 | B2 * | 1/2011 | Williams et al. .......... | 257/513 |
| 8,248,875 | B2 * | 8/2012 | Kajigaya ................ | 365/202 |
| 8,470,669 | B2 * | 6/2013 | Jan et al. ................ | 438/264 |
| 2009/0201742 | A1 * | 8/2009 | Lee et al. .............. | 365/185.24 |
| 2010/0025756 | A1 * | 2/2010 | Fu et al. ................ | 257/328 |
| 2010/0039163 | A1 | 2/2010 | Nagasawa et al. | |
| 2011/0032405 | A1 * | 2/2011 | Nozaki et al. ........... | 348/308 |
| 2012/0168869 | A1 * | 7/2012 | Hikida .................... | 257/365 |
| 2012/0228691 | A1 * | 9/2012 | Dunga et al. ........... | 257/315 |
| 2013/0015517 | A1 * | 1/2013 | Widjaja et al. .......... | 257/316 |

FOREIGN PATENT DOCUMENTS

JP     2010-45182 A    2/2010

* cited by examiner

Primary Examiner — Dismery Mercedes
(74) Attorney, Agent, or Firm — Cantor Colburn LLP (57) ABSTRACT

A semiconductor integrated circuit device has a p-type substrate to which a ground voltage is applied and a floating-type NMOSFET which is integrated on the p-type substrate and to which a negative voltage lower than the ground voltage is applied. The floating-type NMOSFET includes an n-type buried layer buried in the p-type substrate, a high voltage n-type well formed on the n-type buried layer and floats electrically, a p-type drift region formed in the n-type well, an n-type drain region and an-type source region formed in the p-type drift region, and a gate electrode formed on a channel region interposed between the n-type drain region and the n-type source region. The high voltage n-type well includes an n-type tunnel region, with a higher impurity concentration than that of the high voltage n-type well, inside a peripheral region formed so as to surround the p-type drift region.

15 Claims, 7 Drawing Sheets

SEMICONDUCTOR INTEGRATED CIRCUIT DEVICE, MAGNETIC DISK STORAGE DEVICE, AND ELECTRONIC APPARATUS

BACKGROUND OF THE INVENTION

1. Field of the Invention

The invention described in this specification relates to a semiconductor integrated circuit device handling a negative voltage.

2. Description of Related Art

As examples of a technology related to the semiconductor integrated circuit device handling a negative voltage, there is JP-A-2010-288425.

However, when a negative voltage is applied to floating-type NMOSFETs insulated to a p-type substrate electrically with an n-type buried layer, a conventional semiconductor integrated circuit device has a problem that parasitic bipolar transistors which are attached to the floating-type NMOSFETs become active and cause latch-up, and besides, an unintentional reactive current flows.

SUMMARY OF THE INVENTION

In light of the above problem found by the applicant, it is an object of the present invention to provide a semiconductor integrated circuit device that is able to reduce a reactive current during occurrence of latch-up.

A semiconductor integrated circuit device according to the present invention has a p-type substrate to which a ground voltage is applied and a floating-type NMOS FET which is integrated on the p-type substrate and to which a negative voltage lower than the ground voltage is applied; wherein the floating-type NMOS FET includes an n-type buried layer which is buried in the p-type substrate, a high voltage n-type well which is formed on the n-type buried layer and floats electrically, a p-type drift region which is formed in the n-type well, an n-type drain region and an-type source region which are formed in the p-type drift region, and a gate electrode which is formed on a channel region interposed between the n-type drain region and the n-type source region, and wherein the high voltage n-type well includes an n-type tunnel region, with a higher impurity concentration than that of the high voltage n-type well, inside a peripheral region formed so as to surround the p-type drift region.

Here, as to the invention described in present specification, other features, elements, steps, advantages and characteristics of the present invention will become more apparent from the following detailed description of preferred embodiments of the present invention and the attached drawings.

DETAILED DESCRIPTION OF PREFERRED EMBODIMENTS

Motor Drive Device

Figure 1:
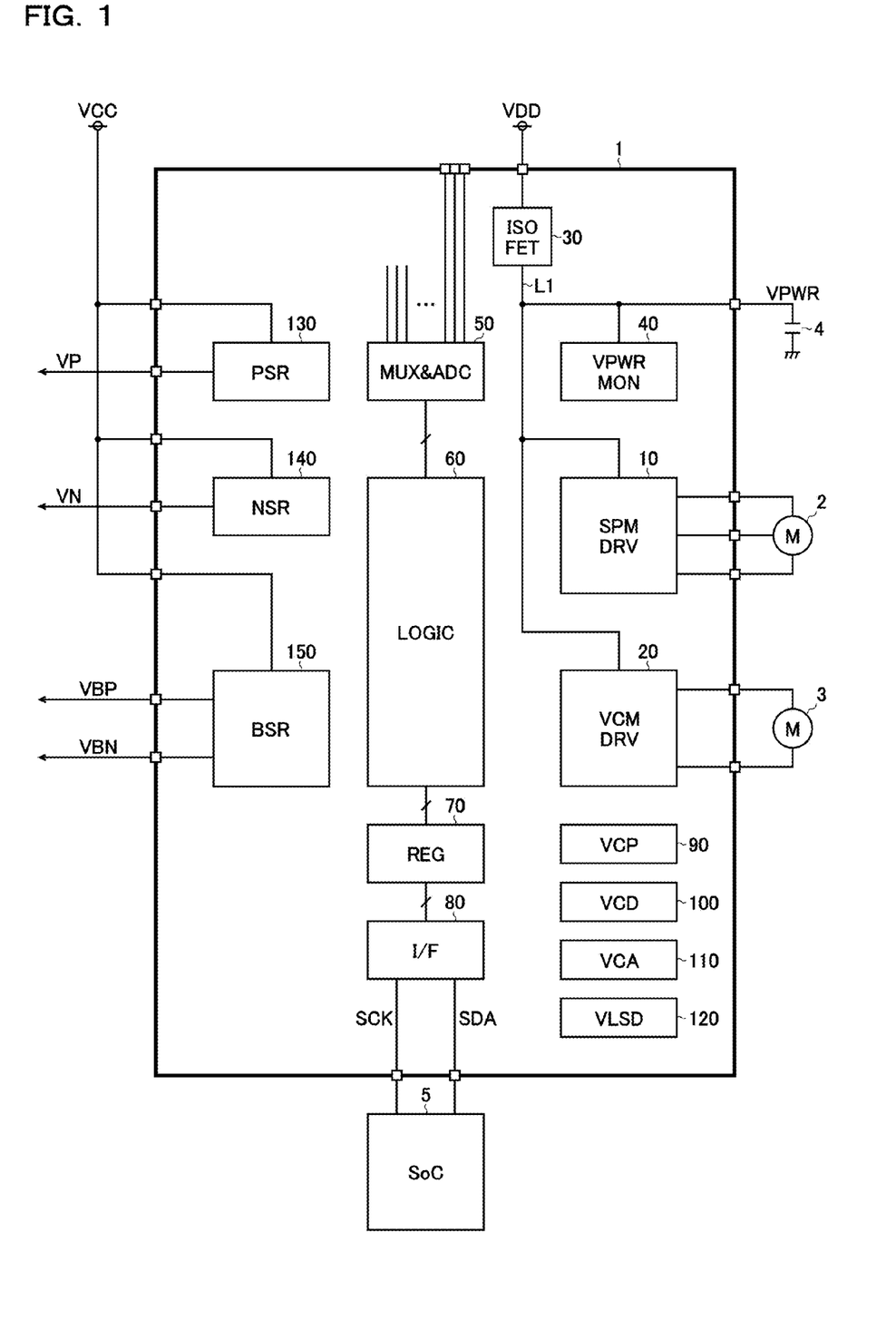
FIG. 1 is a block diagram showing a structural example of a motor drive device.

FIG. 1 is a block diagram showing a structural example of a motor drive device. The motor drive device 1 of this structural example is a monolithic semiconductor integrated circuit device (i.e., a system motor driver LSI) which performs drive control of a spindle motor 2 and a voice coil motor 3 used in a hard disk drive: has a spindle motor driver 10; a voice coil motor driver 20; an insulation switch 30; a power voltage monitor 40; AD converter 50; a logic unit 60; a register 70; serial interface 80; a charge pump 90; an internal regulator 100, 110 and 120, a step-down switching regulator 130; an inverting switching regulator 140; and step-up switching regulator 150.

Besides, the motor drive device 1 has various kinds of sensor detection circuits to monitor an output of an external sensor (a shock sensor, a pressure sensor, a temperature sensor, and so on) except the above-mentioned structural elements. Here, the whole structure of the hard disk drive that incorporates the motor drive device 1 are illustrated below in detail.

A power supply voltage VDD (e.g., 12V) is applied from a host of an external device to a power supply line L1 of a motor drive system as a power voltage VPWR for driving the spindle motor 10 and the voice coil motor driver 20. Here, a capacitor 4 for smoothing the power voltage VPWR is provided in the form of an external component to the power supply line L1.

The spindle motor driver 10 is connected to the power supply line L1, and rotates a platter (a magnetic disk) at predetermined rotation speeds by rotating the spindle motor 2 (e.g., a 3-phase brush less DC motor in the present structural example) with the power supply voltage VDD when the power supply voltage VDD is normal. On the other hand, the spindle motor driver 10 rectifies phase voltages, one for each phase, generated during idling of the spindle motor 2, and regenerates rectified phase voltages to the power supply line L1 as the power voltage VPWR when the power supply voltage VDD is abnormal (e.g., power supply interruptions, instantaneous power failure, and so on). The power voltage VPWR is provided for relevant parts (e.g., the voice coil motor 20 etc.) of the motor drive device 1 via the power supply line L1.

The voice coil motor driver 20 is connected to the power supply line L1, and moves a magnetic head on the platter in a tracking mode by driving the voice coil motor 3 with the power supply voltage VDD when the power supply voltage VDD is normal. On the other hand, the voice coil motor driver 20 drives the voice coil motor 20 with the power voltage VPWR regenerating from the spindle motor driver 10 to the power supply line L1 when the power supply voltage VDD is abnormal. Thus, it is possible to operate the magnetic head automatically to an outside lamp mechanism further than an outermost circumference of the platter. A collision between the magnetic head and the platter is avoidable in advance by possessing such a power off retract function when the power supply voltage VDD is abnormal.

The insulation switch 30 is a backflow prevention element which connects and disconnects a power supply pin (an external terminal to apply the power supply voltage VDD) of the motor driver 1 and the power supply line L1 to and from each other. The insulation switch 30 turns on when the power supply voltage VDD is normal, and turns off when the power supply voltage VDD is abnormal. A MOSFET [metal oxide semiconductor field effect transistor], a diode and the like are preferably usable as the insulation switch 30.

The power voltage monitor 40 monitors the power voltage VPWR applied to the power supply line L1 to decide that the power voltage VPWR is normal or abnormal (consequently, to decide that the power supply voltage VDD is normal or abnormal). The decision of the power voltage monitor 40 is used for on/off control of the insulation switch 30, operation mode switch control (switch control of normal mode/rectified regeneration mode) of the spindle motor driver 10, etc.

The A/D converter 50 converts a plurality of analog signals inputted from the inside and the outside of devices into digital signals to output the digital signals to the logic unit 60.

The logic unit 60 controls entire operation of the motor drive device 1 based on various digital signals inputted from the A/D converter 50, various register data read from the register 70, and so on.

The register 70 stores the various register data written from a microcomputer 5 (SoC [system-on chip]) and the logic unit 60 in a volatile manner.

The serial interface 80 performs, for example, serial communication with the microcomputer 5 (a main element controlling entire operation of a hard disk drive) located to the outside of the motor drive device 1 based on a SPI [serial peripheral interface] standard.

The charge pump 90 generates a step-up voltage VCP (e.g., VPWR+5V) by raising the power voltage VPWR in charge pump operation.

The internal regulator 100 generates an internal power supply voltage VCD (e.g., 1.5V) for a digital system by stepping down the power supply voltage VDD (e.g., 12V) or a power supply voltage VCC (e.g., 5V).

The internal regulator 110 generates an internal power supply voltage VCA (e.g., 1.5V) for an analog system by stepping down the power supply voltage VDD or the power supply voltage VCC.

The internal regulator 120 generates an internal power supply voltage VLSD (e.g., 5V) for driving a low side gate by stepping down the step-up voltage VCP.

The step-down switching regulator 130 generates a positive voltage VP (e.g., 0.9V, 1.8V, 2.5V, or 3.3V) by stepping down the power supply voltage VCC. The positive voltage VP is used as a positive power supply voltage (e.g., a power supply voltage for a core of the microcomputer 5, a power supply voltage for I/F, or a power supply voltage for a memory) of each part of the hard disk drive.

The inverting switching regulator 140 generates a negative voltage VN (e.g., -5V) by inverting the power supply voltage VCC. The negative voltage VN is used as a negative power supply voltage (e.g., a negative power supply voltage for a head amplifier) of each part of the hard disk drive.

The step-up switching regulator 150 generates a positive step-up voltage VBP and a negative step-up voltage VBN (e.g., ±17V) by stepping up the power supply voltage VCC to a positive direction and a negative direction. The positive step-up voltage VBP and the negative step-up voltage VBN are respectively used as a positive and negative power supply voltage (e.g., a positive and negative power supply voltage for a piezoelectric actuator built into the magnetic head) of each part of the hard disk drive.

Inverting (Negative Output Type) Switching Regulator

Figure 2:
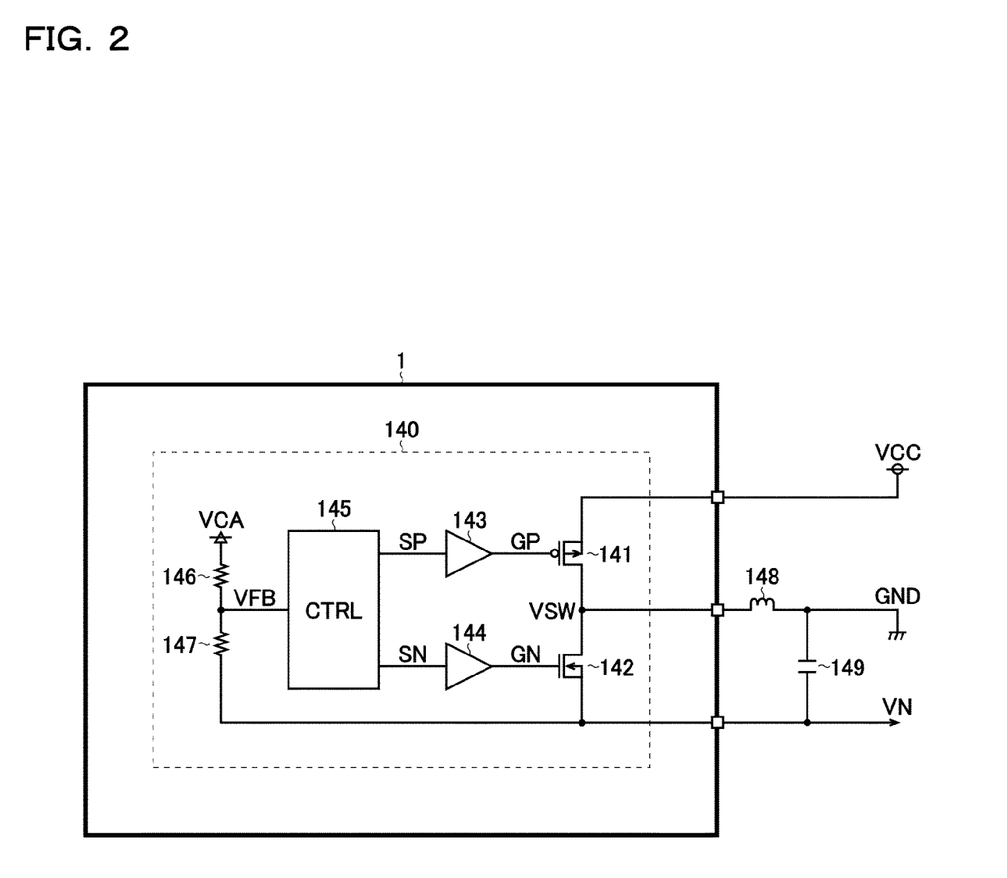
FIG. 2 is a block diagram showing a first structural example of an inverting switching regulator 140.

FIG. 2 is a block diagram showing a first structural example of an inverting switching regulator 140. The inverting switching regulator 140 in the present structural example is a negative output type switching regulator which generates the negative voltage VN from the power supply voltage VCC and includes a double diffusion-type PMOSFET 141 (hereinafter, referred to as a PDMOSFET [P-channel-type double-diffused MOSFET] 141), a floating-type NMOSFET 142 (hereinafter, referred to as a FNMOSFET [floating N-channel-type MOSFET] 142), pre-drivers 143 and 144, a controller 145, resistors 146 and 147, an inductor 148, and a capacitor 149. Here, the inductor 148 and the capacitor 149 are discrete parts provided in the form of external components to the motor drive device 1.

The PDMOSFET 141 and the FNMOSFET 142 are switch elements (an output transistor and a synchronous rectifier transistor) which form a power output stage of the inverting switching regulator 140. As to specific connection relations, a source and a back gate of the PDMOSFET 141 are connected to an application terminal of the power supply voltage VCC. Each drain of the PDMOSFET 141 and the FNMOSFET 142 is connected to a first terminal of the inductor 148 (an application terminal of a switch voltage VSW). A source of the FNMOSFET 142 is connected to an application terminal of the negative voltage VN. A gate of the PDMOSFET 141 is connected to an output terminal of the pre-driver 143 (an application terminal of a gate voltage GP). A gate of the FNMOSFET 142 is connected to an output terminal of the pre-driver 144 (an application terminal of a gate voltage GN). A second terminal of the inductor 148 and a first terminal of the capacitor 149 are connected to the ground terminal (an application terminal of the ground voltage GND). A second terminal of the capacitor 149 is connected to the application terminal of the negative voltage VN.

The pre-driver 143 generates the gate voltage GP in accordance with a control signal SP inputted from the controller 145. If the gate voltage GP is at a high level, the PDMOSFET 141 is turned off. If the gate voltage GP is at a low level, the PDMOSFET 141 is turned on.

The pre-driver 144 generates the gate voltage GN in accordance with a control signal SN inputted from the controller 145. If the gate voltage GN is at a high level, the FNMOSFET 142 is turned on. If the gate voltage GN is at a low level, the FNMOSFET 142 is turned off.

The controller 145 generates the control signals SP and SN in accordance with a feedback voltage VFB. For example, when an absolute value of the negative voltage VN becomes small and the feedback voltage VFB becomes higher than a predetermined threshold voltage, the controller 145 sets the control signals SP and SN to a low level so as to turn on the PDMOSFET 141 and turn off the FNMOSFET 142. After that, the controller 145 sets the control signals SP and SN to a high level so as to turn off the PDMOSFET 141 and turn on the FNMOSFET 142 when arriving at a predetermined switch timing (for example, when a predetermined on-time has passed, or when a current flowing through the inductor 148 has become a prescribed value.).

The resistors 146 and 147 form a feedback voltage generator (resistor divider) which generates the feedback voltage VFB in accordance with the negative voltage VN. As to connection relations, a first terminal of the resistor 146 is connected to an application terminal of the internal power supply voltage VCA (e.g., 1.5V). A second terminal of the resistor 146 and a first terminal of the resistor 147 are connected to an output terminal of the feedback voltage VFB. A second terminal of the resistor 147 is connected to the application terminal of the negative voltage VN. Each resistance value (R146 and R147) of the resistors 146 and 147 is set so as to vary the feedback voltage VFB in a voltage range adaptable to an input dynamic range (e.g., 0-1.5V) of the controller 145. Here, in case a target value of the negative voltage VN is executed by variable control, at least one of the resistors 146 and 147 may be variable.

In the switching regulator in the present structural example, if the PDMOSFET 141 is turned on and the FNMOSFET 142 is turned off, a current flows through a path from the application terminal of the power supply voltage VCC to the ground terminal via PDMOSFET 141 and the inductor 148 to store electric energy to the inductor 148. After that, if the PDMOSFET 141 is turned off and the FNMOSFET 142 is turned on, the electric energy stored to the inductor 148 is emitted and a current return through a path from the inductor 148 via the capacitor 149 and the FNMOSFET 142 to the inductor 148 again. At this time, the negative voltage VN lower than ground voltage GND is generated to the second terminal of the capacitor 149 because the first terminal of the capacitor 149 is connected to the ground terminal.

Power Output Stage

Figure 3:
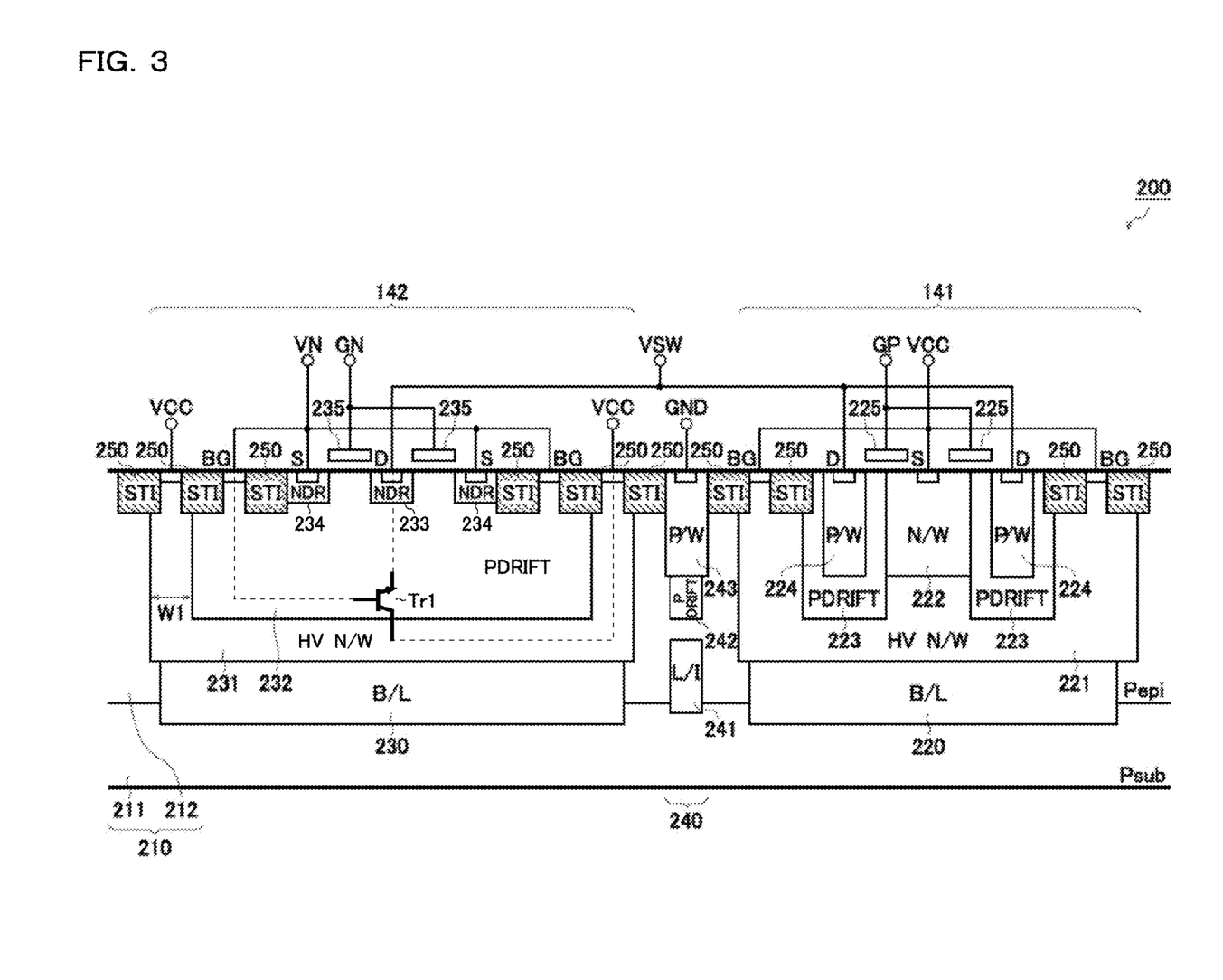
FIG. 3 is a vertical cross section view showing a first structural example of a power output stage.

FIG. 3 is a vertical cross section view showing a first structural example of a power output stage (a PDMOSFET 141 and a FNMOSFET 142) included in the inverting switching regulator 140. In the first structural example, the PDMOSFET 141 and the FNMOSFET 142 which form the power output stage of the inverting switching regulator 140 are located and integrated on the p-type substrate 210 of the semiconductor integrated circuit device 200 (corresponding to the motor drive device 1) so as to impose a p-type contact region 240 and be adjacent to each other. Here, high breakdown voltage elements (e.g., 10V breakdown voltage elements and 15V breakdown voltage elements) which can withstand a difference between the power supply voltage VDD and the negative voltage VN are used as the PDMOSFET 141 and the FNMOSFET 142.

The p-type substrate 210 includes a p-type wafer (Psub) 211 and a p-type epitaxial layer (Pepi) 212 laminated on the p-type wafer 211. Besides, a p-type contact region 240 is formed on the p-type substrate 210 to apply the ground voltage GND.

The p-type contact region 240 includes a p-type lower insulation layer (L/I) 241, a p-type drift region 242, and a p-type well 243. The p-type lower insulation layer 241 is formed near an interface between the p-type wafer 211 and the p-type epitaxial layer 212. The p-type drift region 242 is formed on the p-type lower insulation layer 241. The p-type well 243 is formed on the p-type drift region 242 and is connected to the application terminal of the ground voltage GND (0V).

The PDMOSFET 141 includes an n-type buried layer (B/L) 220, a high voltage n-type well (HV N/W) 221, an n-type source region (N/W) 222, a p-type drift region (PDRIFT) 223, a p-type drain region (P/W) 224, and a gate electrode 225.

The n-type buried layer 220 is buried near the interface between the p-type wafer 211 and the p-type epitaxial layer 212. The high voltage n-type well 221 is formed on the n-type buried layer 220, and is connected to the application terminal of the power supply voltage VCC (+5V) as the back gate of the PDMOSFET 141. The n-type source region 222 is formed in the high voltage n-type well 221, and is connected to the application terminal of the power supply voltage VCC (+5V) as the source of the PDMOSFET 141. The p-type drift region 223 is formed in high voltage n-type well 221 so as to surround the n-type source region 222. The p-type drain region 224 is formed in the p-type drift region 223, and is connected to the application terminal of the switch voltage VSW as the drain of the PDMOSFET 141. The gate electrode 225 is formed on a channel region interposed between the n-type source region 222 and the p-type drain region 224, and is connected to the application terminal of the gate voltage GP as the gate of the PDMOSFET 141.

The FNMOSFET 142 includes an n-type buried layer 230, a high voltage n-type well 231, a p-type drift region 232, an n-type drain region (NDR [n-type doped region]) 233, an n-type source region (NDR) 234 and a gate electrode 235.

The n-type buried layer 230 is buried near the interface between the p-type wafer 211 and the p-type epitaxial layer 212. The high voltage n-type well 231 is formed on the n-type buried layer 230, and is connected to the application terminal of the power supply voltage VCC (+5V) in order to insulate the p-type substrate 210 from the p-type drift region 232 electrically. Here, a peripheral edge region of the high voltage n-type well 231 (annular portion formed so as to surround the p-type drift region 232) is designed as a width W1 (e.g., 7 to 10 μm) similar to the peripheral edge region of the high voltage n-type well included in other FNMOSFETs (not shown) to which the negative voltage VN is not applied. The p-type drift region 232 is formed in the high voltage n-type well 231, and is connected to the application terminal of the negative voltage VN as a back gate of the FNMOSFET 142. The n-type drain region 233 is formed in the p-type drift region 232, and is connected to the application terminal of the switch voltage VSW as the drain of the FNMOSFET 142. The n-type source region 234 is formed in the p-type drift region 232 so as to surround the n-type drain region 233, and is connected to the application terminal of the negative voltage VN as the source of the FNMOSFET 142. The gate electrode 235 is formed on the channel region interposed between the n-type drain region 233 and the n-type source region 234, and is connected to the application terminal of the gate voltage GN as the gate of the FNMOSFET 142.

Here, a plurality of contact pads (terminals for applying voltages) exposed on a surface of the p-type substrate 210 are insulated electrically through an element-insulated layer (STI [shallow trench isolation]) 250. After the shallow trench is formed on the surface of the p-type substrate 210, the element-insulating layer 250 is formed by backfilling an insulator.

According to the first structural example, it is possible to form the power output stage of the inverting switching regulator 140 which outputs the negative voltage VN. However, in the first structural example, the high voltage n-type well 231 of the FNMOSFET 142 is connected to the power supply voltage VCC (+5V). Therefore, a parasitic bipolar transistor Tr1 (hereinafter, referred to as a parasitic transistor Tr1) is turned on, having the high voltage n-type well 231 as the collector thereof, the p-type drift region 232 as the base thereof, and the n-type drain region 233 as the emitter thereof. Consequently, the first structural example forms a reactive current path from contact pads (VCC) of the high voltage n-type well 231 to contact pads (VSW) of the n-type drain region 233.

Figure 4:
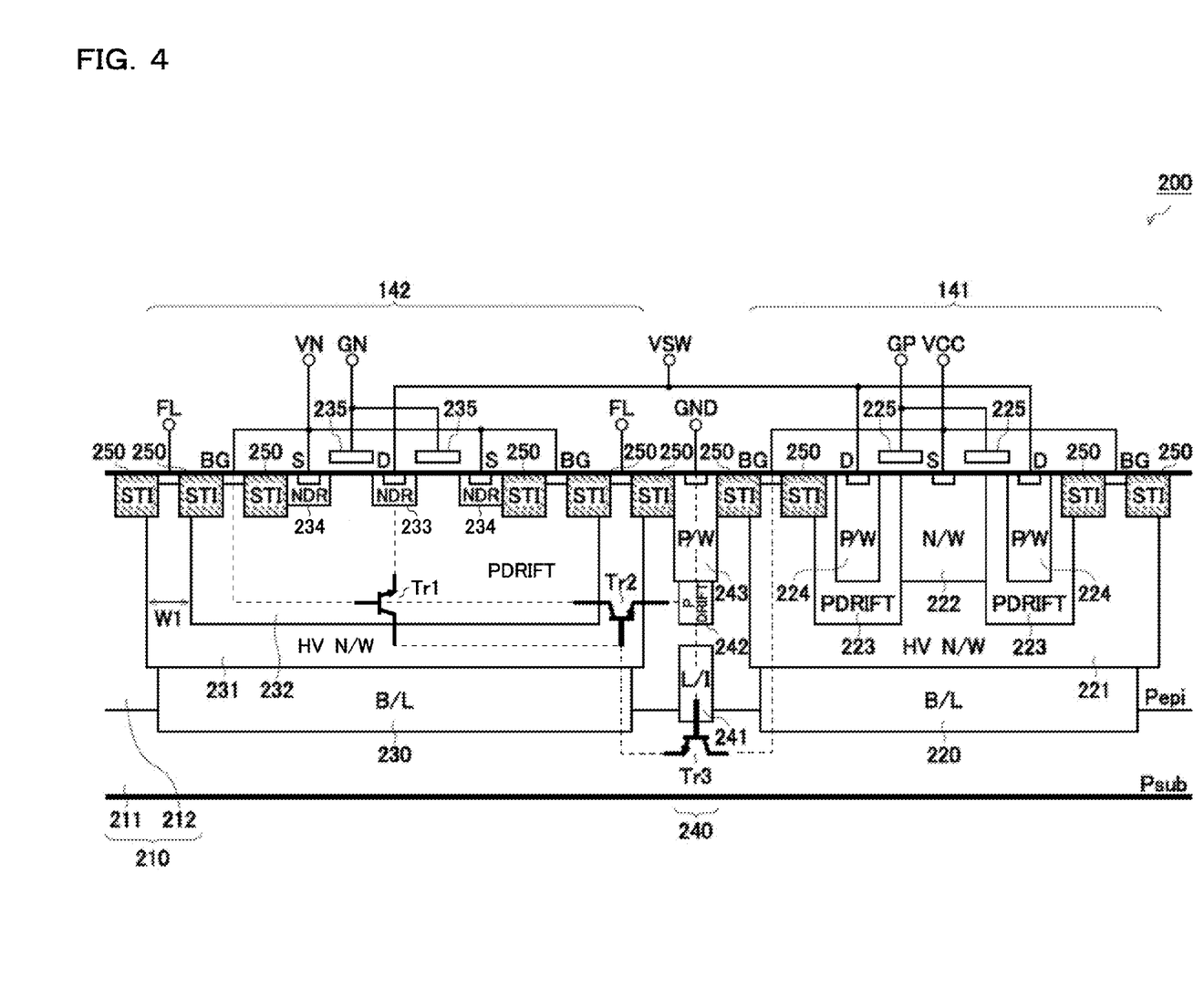
FIG. 4 is a vertical cross section view showing a second structural example of a power output stage.

FIG. 4 is a vertical cross section view showing a second structural example of a power output stage. The power output stage in the second structural example is composed of the same vertical structure as the first structural example. However, in the power output stage in the second structural example, it is different from the first structural example that the high voltage n-type well 231 is not connected to the application terminal of the power supply voltage VCC (+5V) and floats electrically.

In the second structural example, the high voltage n-type well 231 floats electrically. Therefore, the reactive current path from the contact pads (VCC) of the high voltage n-type well 231 to contact pads (VSW) of the n-type drain region 233 is cut off.

However, in the second structural example, the parasitic transistor Tr1 draws a base current of a parasitic bipolar transistor Tr2 (hereinafter, referred to as a parasitic transistor Tr2) having the p-type drift region 232 as the collector thereof, the high voltage n-type well 231 as the base thereof, and the p-type substrate 210 (the p-type contact region 240) as the emitter thereof. Therefore, the parasitic transistor Tr2 is turned on. On the other hand, the parasitic transistor Tr2 provides the current drawn from the p-type substrate 210 for the base of the parasitic transistor Tr1. Therefore, the parasitic transistor Tr1 is turned on. As described above, a reactive current pass from contact pads (GND) of the p-type substrate 210 to the contact pads (VSW) of the n-type source region 233 is formed in the second structural example because a thyristor structure is formed by the parasitic transistors Tr1 and Tr2.

Besides, in the second structural example, a parasitic bipolar transistor Tr3 (hereinafter, referred to as a parasitic transistor Tr3) is turned on, having the high voltage n-type well 221 of the PDMOSFET 141 as the collector thereof, the p-type contact region 240 of the p-type substrate 210 (in particular, a p-type lower insulation layer 241) as the base thereof, and the high voltage n-type well 231 as the emitter thereof. Consequently, a reactive current also flows through a path from contact pads (VCC) of the high voltage n-type well 221 to the collector of the parasitic transistor Tr1 in the second structural example.

Figure 5:
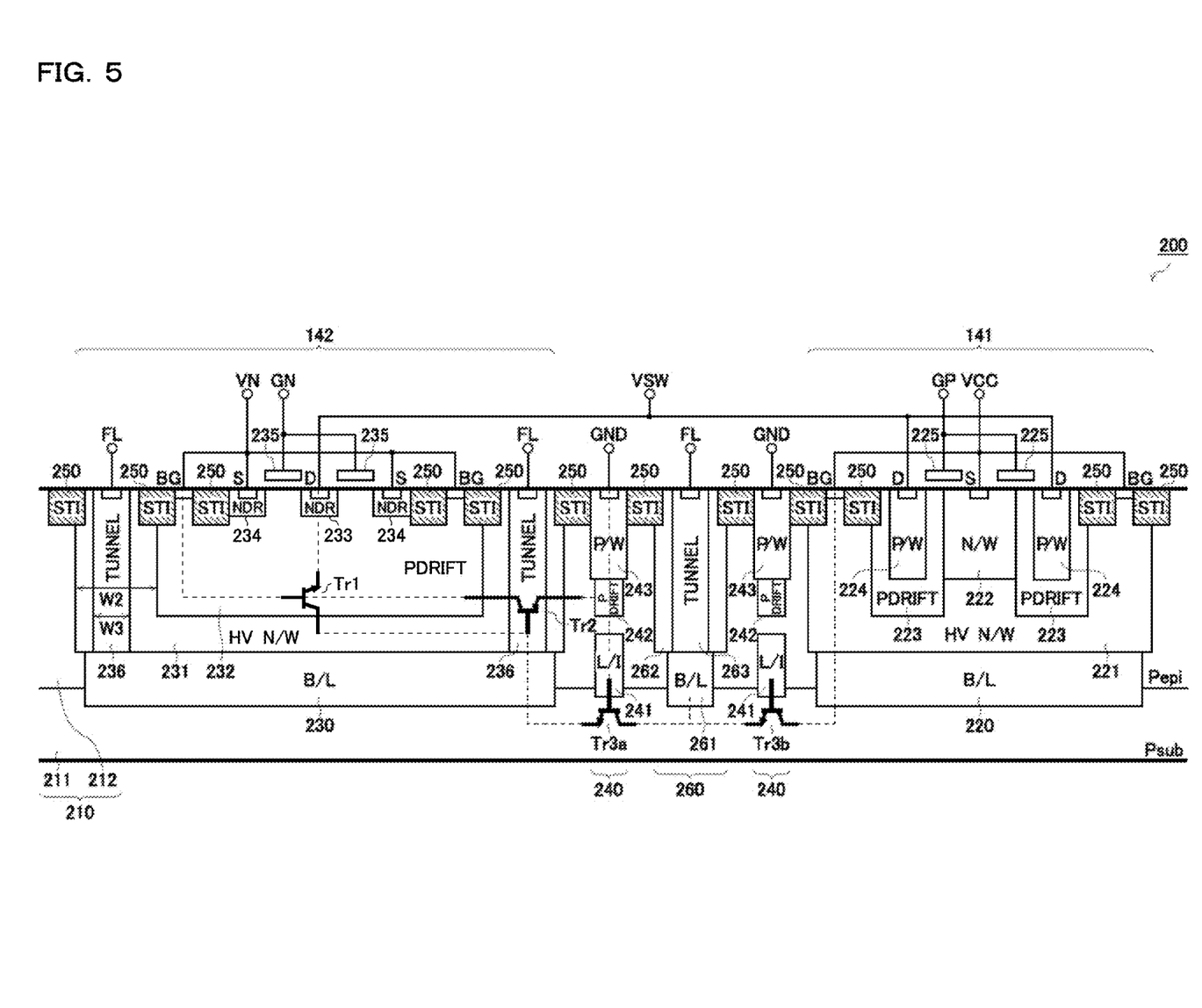
FIG. 5 is a vertical cross section view showing a third structural example of a power output stage.

FIG. 5 is a vertical cross section view showing a third structural example of a power output stage. The power output stage in the third structural example is the same as that in the second structural example with respect to an electrically floating state of the contact pads of the high voltage n-type well 231. However, the structure in third structural example has still more ideas.

More specifically, in the output power stage in the third structural example, the high voltage n-type well 231 of the FNMOSFET 142 includes an n-type tunnel region (n-type guard ring region) 236 greater than an impurity concentration of the high voltage n-type well 231 inside the peripheral edge region formed so as to surround the p-type drift region 232. By adopting such a structure, it is possible to reduce a direct current amplification factor hFE of the parasitic transistor Tr2. Therefore, it is possible to cut off a reactive current path by dissolving the thyristor structure formed by the parasitic transistors Tr1 and Tr2.

In particular, in the output power stage in the third structural example, the peripheral edge region of the high voltage n-type well 231 is designed to a width W2 (e.g., 40 μm) broader than the width W1 of the above-mentioned first structural example (FIG. 3) and second structural example (FIG. 4), and the n-type tunnel region 236 occupies a width W3 (e.g., 30 μm) of the width W2. By adopting such a structure, it is possible to enjoy the above effect certainly.

Besides, in the output power stage in the third structural example, the semiconductor integrated circuit device 200 has an n-type dummy region 260 integrated on the p-type substrate 210 so as to be interposed between the FNMOSFET 142 and the PDMOSFET 141. The n-type dummy region 260 has an n-type buried layer 261 and a high voltage n-type well 262. The n-type buried layer 261 is buried near the interface between the p-type wafer 211 and the p-type epitaxial layer 212. The high voltage n-type well 262 is formed on the n-type buried layer 261 and floats electrically. Besides, the high voltage n-type well 262 includes an n-type tunnel region 263 with a higher impurity concentration than that of the high voltage n-type well 262 therein.

In addition, as to the power output stage in the third structural example, the p-type contact region 240 for applying the ground voltage GND to the p-type substrate 210 is formed so as to surround the n-type dummy region 260.

By adopting such a structure, two parasitic transistors Tr3*a* and Tr3*b* are connected in series on the path from the contact pads (VCC) of the high voltage n-type well 221 to the collector of the parasitic transistor Tr1 unlike the above-mentioned second structural example (FIG. 4). Accordingly, it is possible to reduce apparently a direct current amplification factor hFE of the parasitic transistor Tr3 shown in FIG. 4. Therefore, it is possible to reduce a reactive current provided for the collector of the parasitic transistor Tr1.

Application to Hard Disk Drive

Figure 6:
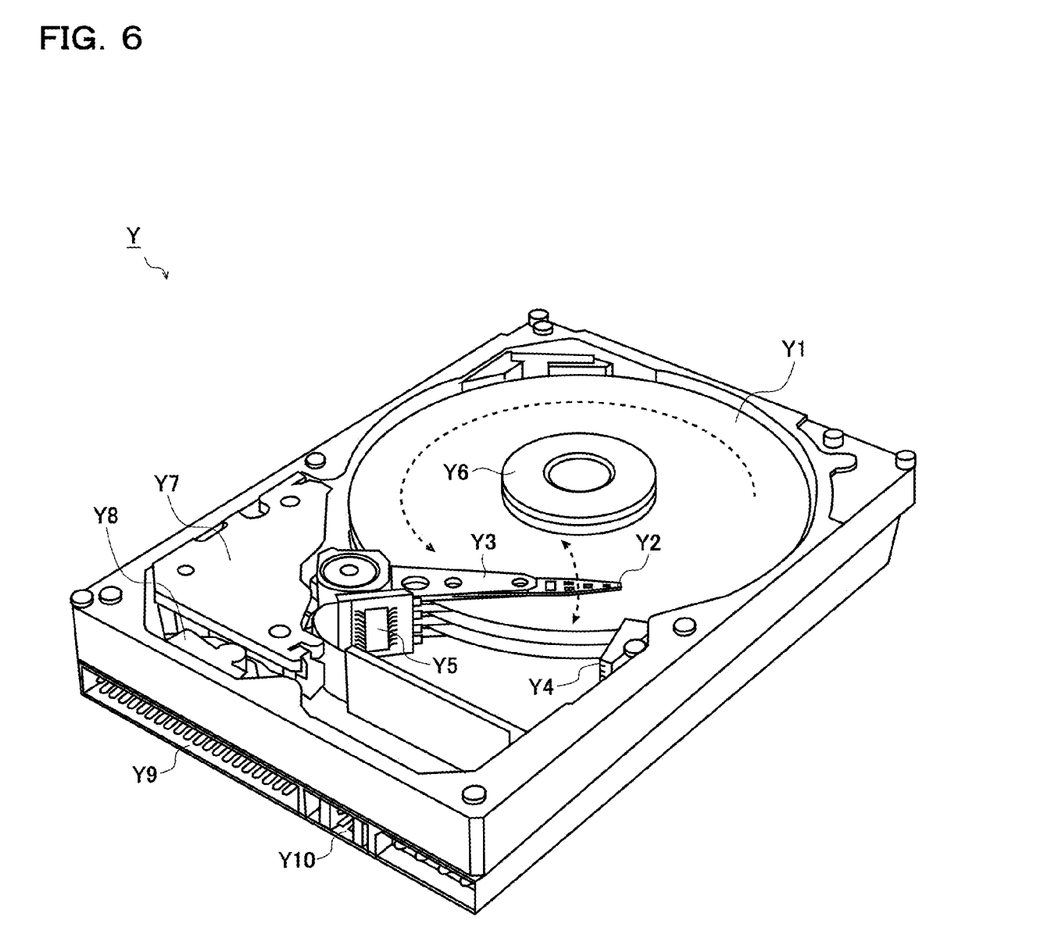
FIG. 6 is a perspective view showing a structural example of a hard disk drive provided with a motor drive device.

FIG. 6 is a perspective view (with a top cover removed) showing a structural example of a hard disk drive that incorporates the motor drive device. A hard disk drive Y in the present structural example is a kind of magnetic disk storage device and has: a platter Y1; a magnetic head Y2; a swing arm Y3; a lamp mechanism Y4; a head amplifier Y5; a spindle motor Y6; a voice coil motor Y7; a latch mechanism Y8; an interface connector Y9; and a jumper switch Y10.

The platter Y1 is a magnetic disk that is formed by laminating a magnetic layer on a surface of an aluminum board or a glass board. One hard disk drive Y incorporates one to four platters Y1.

The magnetic head Y2 reads and writes data to and from the platter Y1.

The swing arm Y3 holds the magnetic head Y2 at a tip end thereof.

The lamp mechanism Y4 is an evacuation place for the magnetic head Y2 during a time the platter Y1 does not rotate, and is disposed further outside an outermost circumference of the platter Y1.

The head amplifier Y5 amplifies a regenerative signal obtained by the magnetic head Y2.

The spindle motor Y6 (corresponding to the spindle motor 2 in FIG. 1) rotates the platter Y1 at predetermined rotation speeds (4200 rpm, 5400 rpm, 7200 rpm, 10000 rpm, 15000 rpm and the like).

The voice coil motor Y7 (corresponding to the voice coil motor 3 in FIG. 1) moves the swing arm Y3 in an arc, thereby moving the magnetic head Y2 in a radial direction of the platter Y1.

The latch mechanism Y8 holds the swing arm Y3 during a time the hard disk drive Y is stopped.

The interface connector Y9 is connected to a host interface circuit, which is mounted on a mother board of a personal computer and the like, over a cable.

The jumper switch Y10 is a switch for performing the machine setting (master/slave and the like) of the hard disk drive Y by means of a jumper pin when connecting a plurality of the hard disk drives to one personal computer.

Here, though not shown in FIG. 6, the hard disk drive Y is provided with a printed board on which the microcomputer (Soc) and various electronic circuits are mounted. The motor drive device 1 in FIG. 1 is mounted on the above-mentioned printed board as a means for driving the spindle motor Y6 and the voice coil motor Y7.

Application to Desktop Personal Computer

Figure 7:
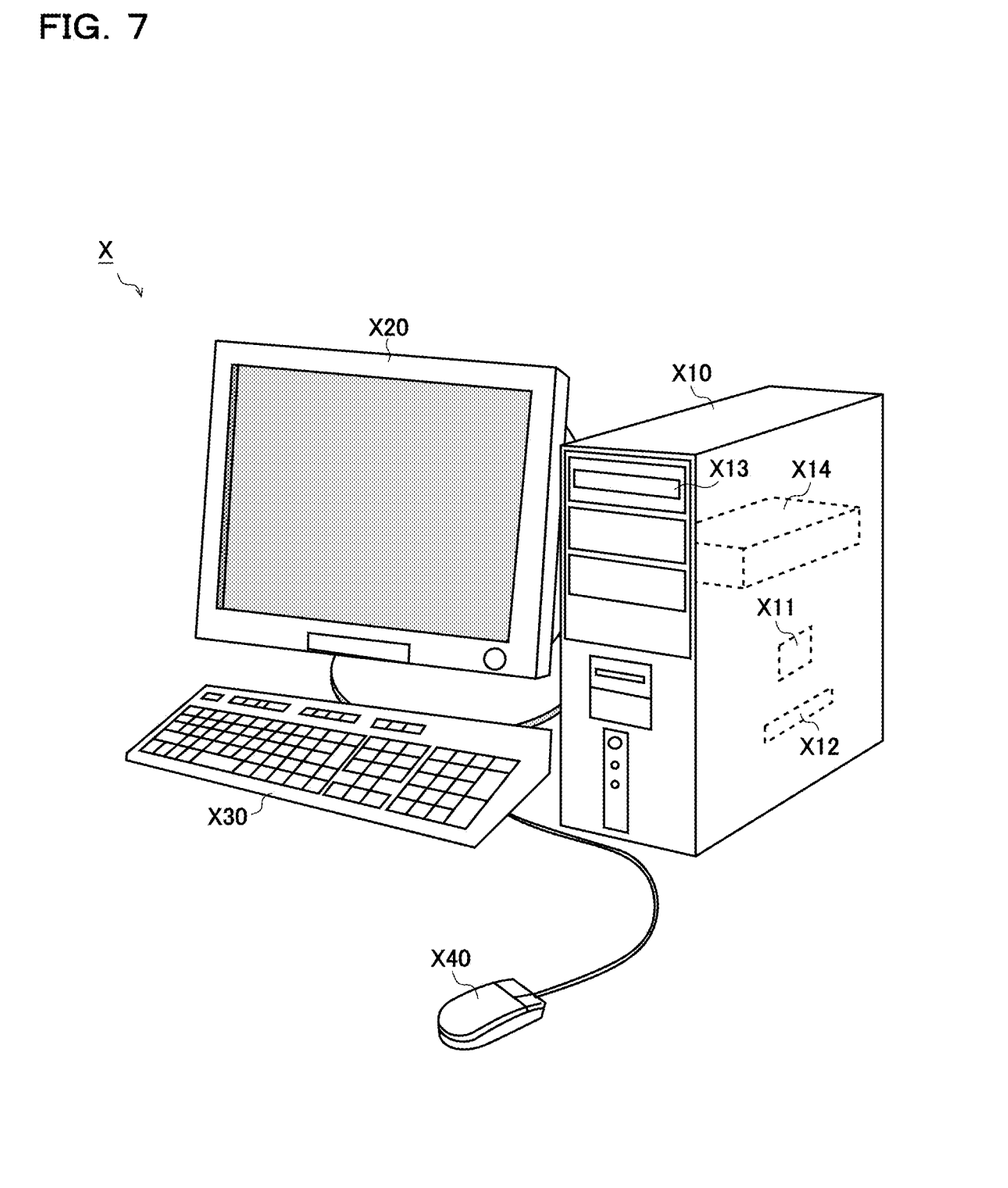
FIG. 7 is an appearance view showing a structural example of a personal computer that incorporates a hard disk drive.

FIG. 7 is an appearance view showing a structural example of a desktop personal computer that incorporates the hard disk drive. A desktop personal computer X in the present structural example has: a main body case X10; a liquid crystal monitor X20; a keyboard X30; and a mouse X40.

The main body case X10 houses: a central processing unit X11; a memory X12; an optical drive X13; a hard disk drive X14 and the like.

The central processing unit X11 executes an operating system and various application programs stored in the hard disk drive X14, thereby controlling comprehensively operation of the desktop personal computer X.

The memory X12 is used as a working region (e.g., a region for storing task data when executing a program) for the central processing unit X11.

The optical drive X13 performs reading/writing of data to and from an optical disk. As the optical disk, there are a CD [compact disk], a DVD [digital versatile disc], a BD [Blu-ray disc] and the like.

The hard disk drive X14 (corresponding to the hard disk drive Y in FIG. 10) is a large-capacity auxiliary storage device that stores the programs and data in a non-volatile way by means of a magnetic disk sealed tightly in the housing.

The liquid crystal monitor X20 outputs an image based on an instruction from the central processing unit X11.

The keyboard X30 and the mouse X40 are each a human interface device that accepts operation by a user.

Other Modifications

In the above embodiments, a hard disk drive is given as an example of applications which incorporate the motor drive device. Besides, it is possible to incorporate the motor drive device into the applications other than the hard disk drive.

In addition, in the above embodiments, a desktop personal computer is given as an example of electronic apparatus which incorporate the hard disk drive. Besides, it is possible to incorporate the hard disk drive into the electronic apparatus (laptop computers, tablet personal computers, hard disk recorders, audio players, game machines and the like) other than the desktop personal computer.

Besides, in addition to the above embodiments, it is possible to add various modifications to the invention disclosed in the present specification without departing the spirit of the technological creation. In other words, it should be understood that the above embodiments are examples in all respects and are not limiting, the technological scope of the present invention is not indicated by the above embodiments but by the claims, and all modifications within the scope of the claims and the meaning equivalent to the claims are covered.

INDUSTRIAL APPLICABILITY

The invention disclosed in the present specification is usable, for example, as a system motor driver LSI for a HDD [hard disk drive] controller.

LIST OF REFERENCE NUMERALS 1 motor drive device (semiconductor integrated circuit device)
2 spindle motor
3 voice coil motor
4 capacitor
5 microcomputer (SoC)
10 spindle motor driver
20 voice coil motor driver
30 isolation switch (NMOSFET)
40 power voltage monitor
50 A/D converter
60 logic unit
70 register
80 serial interface
90 charge pump
100, 110, 120 internal regulators (digital/analog/lower side gates)
130 step-down switching regulator (positive output type)
140 inverting switching regulator (negative output type)
141 double diffusion-type PMOSFET (PDMOSFET)
142 floating-type NMOSFET (FNMOSFET)
143, 144 pre-drivers
145 controller
146, 147 resistors
148 inductor
149 capacitor
150 step-up switching regulator (positive and negative output type)
200 semiconductor integrated circuit device (motor drive device)
210 p-type substrate
211 p-type wafer
212 p-type epitaxial layer
220 n-type buried layer
221 high voltage n-type well
222 n-type source region
223 p-type drift region
224 p-type drain region
225 gate electrode
230 n-type buried layer
231 high voltage n-type well
232 p-type drift region
233 n-type drain region
234 n-type source region
235 gate electrode
236 n-type tunnel region (n-type guard ring region)
240 p-type contact region
241 p-type lower insulation layer (L/I layer)
242 p-type drift region
243 p-type well
250 element-insulating layer (STI layer)
260 n-type dummy region
261 n-type buried layer
262 high voltage n-type well
263 n-type tunnel region
Tr1, Tr2, Tr3 parasitic bipolar transistors
L1 power supply line
X desktop personal computer
X10 main body case
X11 central processing unit
X12 memory
X13 optical drive
X14 hard disk drive
X20 liquid crystal monitor
X30 keyboard
X40 mouse
Y hard disk drive
Y1 platter (magnetic disk)
Y2 magnetic head
Y3 swing arm
Y4 lamp mechanism
Y5 head amplifier
Y6 spindle motor
Y7 voice coil motor
Y8 latch mechanism
Y9 interface connector
Y10 jumper switch

What is claimed is:

1. A semiconductor integrated circuit device comprising:
a p-type substrate to which a ground voltage is applied; and
a floating-type NMOS FET which is integrated on the p-type substrate and to which a negative voltage lower than the ground voltage is applied, wherein
the floating-type NMOS FET includes:
an n-type buried layer which is buried in the p-type substrate;
a high voltage n-type well which is formed on the n-type buried layer and floats electrically;
a p-type drift region which is formed in the n-type well;
an n-type drain region and an-type source region which are formed in the p-type drift region; and
a gate electrode which is formed on a channel region interposed between the n-type drain region and the n-type source region, and wherein
the high voltage n-type well includes an n-type tunnel region, with a higher impurity concentration than that of the high voltage n-type well, inside a peripheral region formed so as to surround the p-type drift region, and wherein
peripheral edge region of the voltage n-type well is designed to a width broader than that of a high voltage n-type well included in an other floating-type NMOS FET to which the negative voltage is not applied.

2. The semiconductor integrated circuit device according to claim 1, further comprising:
a p-type contact region which applies the ground voltage to the p-type substrate; and
a double diffusion-type PMOSFET which is integrated on the p-type substrate so as to impose the p-type contact region and be adjacent to the floating-type NMOS FET.

3. The semiconductor integrated circuit device according to claim 2, wherein
the double diffusion-type PMOSFET includes:
a second n-type buried layer which is buried in the p-type substrate;
a second high voltage n-type well which is formed on the second n-type buried layer and to which a power supply voltage higher than the ground voltage is applied;
a second n-type source region which is formed in the second high voltage n-type well;
a second p-type drift region which is formed in the second high voltage n-type well;
a p-type drain region which is formed in the second p-type drift region; and
a second gate electrode which is formed on a channel region interposed between the second n-type source region and the p-type drain region.

4. The semiconductor integrated circuit device according to claim 3, further comprising:
an n-type dummy region which is integrated on the p-type substrate so as to be interposed between the floating-type NMOSFET and the double diffusion-type PMOSFET.

5. The semiconductor integrated circuit device according to claim 4, wherein
the n-type dummy region includes:
a third n-type buried layer which is buried in the p-type substrate; and
a third high voltage n-type well which is formed on the third n-type buried layer and floats electrically.

6. The semiconductor integrated circuit device according to claim 5, wherein the third high voltage n-type well includes a second n-type tunnel region with a higher impurity concentration than that of the third high voltage n-type well therein.

7. The semiconductor integrated circuit device according to claim 4, wherein
the p-type contact region is formed so as to surround the n-type dummy region.

8. The semiconductor integrated circuit device according to claim 3, wherein
the n-type drain region and the p-type drain region are connected to each other as each drain of the floating-type NMOSFET and the double diffusion-type PMOSFET respectively, wherein
the n-type source region and the p-type drift region are connected to an application terminal of the negative voltage as a source and a back gate of the floating-type NMOSFET respectively, and wherein
the second n-type source region and the second high voltage n-type well is connected to an application terminal of the power supply voltage as a source and a back gate of the double diffusion-type PMOSFET respectively.

9. The semiconductor integrated circuit device according to claim 8, further comprising:
a first pre-driver which generates a first gate voltage of the double diffusion-type PMOSFET in accordance with a first control signal;
a second pre-driver which generates a second gate voltage of the floating-type NMOSFET in accordance with a second control signal;
a feedback voltage generator which generates a feedback voltage in accordance with the negative voltage; and
a controller which generates the first control signal and the second control signal in accordance with the feedback voltage.

10. The semiconductor integrated circuit device according to claim 9, comprising in the form of an external component:
an inductor having a first terminal which is connected to both drains of the floating-type NMOSFET and the double diffusion-type PMOSFET and having a second terminal which is connected to an application terminal of the ground voltage; and
a capacitor having a first terminal which is connected to the application terminal of the ground voltage and having a second terminal which is connected to the application terminal of the negative voltage.

11. The semiconductor integrated circuit device according to claim 1, wherein
the p-type substrate includes:
a p-type wafer; and
a p-type epitaxial layer which is laminated on the p-type wafer.

12. A magnetic disk storage device comprising: a platter; a magnetic head which reads and writes data to and from the platter; a swing arm which holds the magnetic head at a tip end thereof; a spindle motor which rotates the platter; a voice coil motor which moves the swing arm in an arc; and a semiconductor integrated circuit structured to drive the spindle motor and the voice coil motor, and provide the negative voltage for relevant parts of the magnetic disk storage device, the semiconductor integrated circuit comprising:
a p-type substrate to which a ground voltage is applied;
a floating-type NMOS FET which is integrated on the p-type substrate and to which a negative voltage lower than the ground voltage is applied;
a p-type contact region which applies the ground voltage to the p-type substrate;

a double diffusion-type PMOSFET which is integrated on the p-type substrate so as to impose the p-type contact region and be adjacent to the floating-type NMOS FET;

a first pre-driver which generates a first gate voltage of the double diffusion-type PMOSFET in accordance with a first control signal;

a second pre-driver which generates a second gate voltage of the floating-type NMOSFET in accordance with a second control signal;

a feedback voltage generator which generates a feedback voltage in accordance with the negative voltage;

a controller which generates the first control signal and the second control signal in accordance with the feedback voltage;

a spindle motor driver which drives the spindle motor; and a voice coil motor driver which drives the voice coil motor;

wherein the floating-type NMOS FET includes:

an n-type buried layer which is buried in the p-type substrate;

a high voltage n-type well which is formed on the n-type buried layer and floats electrically;

a p-type drift region which is formed in the n-type well;

an n-type drain region and an-type source region which are in the p-type drift region; and a gate electrode which is formed on a channel region interposed between the n-type drain region and the n-type source region, and wherein the high voltage n-type well includes an n-type tunnel region, with a higher impurity concentration than that of the high voltage n-type well, inside a peripheral region formed so as to surround the p-type drift region, and wherein the peripheral edge region of the high voltage n-type well is designed to a width broader than that of a high voltage n-type well included in an other floating-type NMOS FET to which the negative voltage is not applied;

wherein the double diffusion-type PMOSFET comprises:

a second n-type buried layer which is buried in the p-type substrate;

a second high voltage n-type well which is formed on the second n-type buried layer and to which a power supply voltage higher than the ground voltage is applied;

a second n-type source region which is formed in the second high voltage n-type well;

a second p-type drift region which is formed in the second high voltage n-type well;

a p-type drain region which is formed in the second p-type drift region; and a second gate electrode which is formed on a channel region interposed between the second n-type source region and the p-type drain region;

wherein the n-type drain region and the p-type drain region are connected to each other as each drain of the floating-type NMOSFET and the double diffusion-type PMOSFET respectively, wherein the n-type source region and the p-type drift region are connected to an application terminal of the negative voltage as a source and a back gate of the floating-type NMOSFET respectively, and wherein the second n-type source region and the second high voltage n-type well is connected to an application terminal of the power supply voltage as a source and a back gate of the double diffusion-type PMOSFET respectively;

wherein the semiconductor integrated circuit further comprises, in the form of an external component;

an inductor having a first terminal which is connected to both drains of the floating-type NMOSFET and the double diffusion-type PMOSFET and having a second terminal which is connected to an application terminal of the ground voltage; and voltage and having a second terminal which is connected to the application terminal of the negative voltage.

13. The magnetic disk storage device according to claim 12, further comprising:

a head amplifier which amplifies a regenerative signal obtained by the magnetic head; wherein the negative voltage is used as a negative power supply voltage for the head amplifier.

14. An electronic appliance comprising:

a magnetic disk storage device according to claim 12.

15. A semiconductor integrated circuit device comprising:

a p-type substrate to which a ground voltage is applied;

a floating-type NMOS FET which is integrated on the p-type substrate and to which a negative voltage lower than the ground voltage is applied;

a p-type contact region which applies the ground voltage to the p-type substrate; and a double diffusion-type PMOSFET which is integrated on the p-type substrate so as to impose the p-type contact region and be adjacent to the floating-type NMOS FET, wherein the floating-type NMOS FET includes:

an n-type buried layer which is buried in the p-type substrate;

a high voltage n-type well which is formed on the n-type buried layer and floats electrically;

a p-type drift region which is formed in the n-type well;

an n-type drain region and an-type source region which are formed in the p-type drift region; and a gate electrode which is formed on a channel region interposed between the n-type drain region and the n-type source region, and wherein the high voltage n-type well includes an n-type tunnel region, with a higher impurity concentration than that of the high voltage n-type well, inside a peripheral region formed so as to surround the p-type drift region, and wherein the double diffusion-type PMOSFET includes:

a second n-type buried layer which is buried in the p-type substrate;

a second high voltage n-type well which is formed on the second n-type buried layer and to which a power supply voltage higher than the ground voltage is applied;

a second n-type source region which is formed in the second high voltage n-type well;

a second p-type drift region which is formed in the second high voltage n-type well;

a p-type drain region which is formed in the second p-type drift region; and a second gate electrode which is formed on a channel region interposed between the second n-type source region and the p-type drain region.

* * * * *